US009506815B2

(12) United States Patent
Moore et al.

(10) Patent No.: US 9,506,815 B2
(45) Date of Patent: Nov. 29, 2016

(54) TEMPERATURE BAND OPERATION LOGGING (75) Inventors: David A Moore, Tomball, TX (US); Scott P. Faasse, Tomball, TX (US); Jeffrey A. Plank, Cypress, TX (US); Tahir Cader, Liberty Lake, WA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 428 days.

(21) Appl. No.: 14/125,739

(22) PCT Filed: Jun. 27, 2011

(86) PCT No.: PCT/US2011/041980
§ 371 (c)(1),
(2), (4) Date: Dec. 12, 2013

(87) PCT Pub. No.: WO2013/002754
PCT Pub. Date: Jan. 3, 2013

(65) Prior Publication Data
US 2014/0105244 A1 Apr. 17, 2014

(51) Int. Cl.
G01K 3/00 (2006.01)
G01K 3/04 (2006.01)
G06F 1/20 (2006.01)
H05K 7/20 (2006.01)

(52) U.S. Cl.
CPC ............... *G01K 3/04* (2013.01); *G06F 1/206* (2013.01); *H05K 7/20836* (2013.01)

(58) Field of Classification Search
None
See application file for complete search history.

(56) References Cited

U.S. PATENT DOCUMENTS

| 6,374,627 | B1 | 4/2002 | Schumacher et al. | |
| 6,574,104 | B2 | 6/2003 | Patel et al. | |
| 7,191,064 | B1* | 3/2007 | Myers | G01W 1/10 702/3 |
| 7,355,803 | B2 | 4/2008 | Yang | |
| 7,826,216 | B2 | 11/2010 | Moss et al. | |
| 8,909,384 | B1* | 12/2014 | Beitelmal | G06F 1/206 700/19 |
| 2002/0194509 | A1* | 12/2002 | Plante | G06F 1/206 713/300 |
| 2007/0033432 | A1* | 2/2007 | Pecone | G06F 1/305 714/6.12 |
| 2008/0204999 | A1 | 8/2008 | Clidaras et al. | |
| 2010/0037639 | A1 | 2/2010 | Ogden et al. | |
| 2010/0085196 | A1* | 4/2010 | Stiver | H05K 7/20836 340/584 |
| 2010/0251039 | A1 | 9/2010 | Hirohata et al. | |
| 2011/0093126 | A1* | 4/2011 | Toba | G05B 15/02 700/291 |

OTHER PUBLICATIONS http://www.hdsentinel.com/, Hard Disk Sentinel—HDD health and temperature monitoring, Jun. 4, 2011, pp. 1-2.
http://www.maxim-ic.com/datasheet/index.mvp/id/5556, DS1922E, High-Temperature Logger iButton® with 8KB Data-Log Memory, Jun. 4, 2011, pp. 1-2.
International Searching Authority, Appl. No. PCT/US2011/041980, filed Jun. 27, 2011, Search Report and Written Opinion, 9pp, dated Feb. 17, 2012.

* cited by examiner

*Primary Examiner* — Lisa Caputo
*Assistant Examiner* — Nasir U Ahmed
(74) *Attorney, Agent, or Firm* — Hewlett Packard Enterprise Patent Department (57) ABSTRACT

In a system, temperature measurements are logged. From the logged measurements, duration of operation of the system in each of a plurality of temperature bands is determined.

20 Claims, 5 Drawing Sheets

TEMPERATURE BAND OPERATION LOGGING

BACKGROUND

In the art of computing, various systems require cooling. Cooling may be provided at many different levels, such as a data center, a rack in the data center, an enclosure mounted within the rack, or a component within the enclosure.

As is known in the art, the risk of failure of many systems is influenced by operating temperature. Typically, cooler operating temperatures correlate with lower risks of failure. It is common for system manufacturers to specify minimum, nominal, and maximum operating temperatures.

BRIEF DESCRIPTION OF DRAWINGS

The Figures depict embodiments, implementations, and configurations of the invention, and not the invention itself.

DETAILED DESCRIPTION

In the foregoing description, numerous details are set forth to provide an understanding of the examples disclosed herein. However, it will be understood by those skilled in the art that the examples may be practiced without these details. While a limited number of examples have been disclosed, those skilled in the art will appreciate numerous modifications and variations therefrom. It is intended that the appended claims cover such modifications and variations as fall within the true spirit and scope of the examples.

In the art of computing, servers are often deployed in data centers. Typically, data centers are populated with racks having rack mounted servers, storage, and networking equipment. Historically, a cooling infrastructure is provided to cool air and liquid used throughout the data center. The cooling infrastructure can account for a significant portion of data center energy consumption.

In view of the thermal management historically provided in data centers, system vendors typically specify a single maximum temperature for inlet air entering a computer enclosure. A common specified temperature is 35° C. Once a sufficient cooling infrastructure is in place, achieving a desired inlet air temperature is primarily accomplished by adjusting temperature set points of various components of the cooling infrastructure.

Computer equipment is typically covered by a warranty contract, and to be in compliance with the warranty contract, the computer system must be operated within the parameters specified by the vendor. Operation in excess of the specified parameters is a breach of warranty. In addition to a warranty contract, computer systems may be covered by other policies, such as service level agreements (SLAs) and quality of service (QoS) metrics.

More recently, data center operators have desired to increase energy efficiency and reduce the carbon footprints of their data centers. Not only is the cooling infrastructure a major consumer of energy in data centers, it also represents a significant investment.

Free air cooling is a technique where minimally conditioned or completely unconditioned air is brought into a data center for cooling equipment. Many geographical regions have outdoor air temperatures that rarely exceed 35° C. However, significantly fewer regions that are otherwise good data center location candidates have outdoor air temperatures that never exceed 35° C. Accordingly, a specification for inlet air temperature, such as 35° C., can significantly reduce the number of regions that are good candidates for data centers that employ free air cooling and other data center cooling techniques that utilize a more lightweight cooling infrastructure.

While the examples discussed below are well adapted to data centers that use free air cooling, note that the examples may be deployed in any environment where deviations from an ideal operating temperature may occur. For example, a traditional data center may be subject to a cooling equipment failure, or a traditional data center may have a contract with a utility company that limits power consumption during periods of peak usage.

Many systems and components can endure brief periods of operation above a temperature specified by a vendor. For example, assume that extensive testing reveals a relationship between ambient inlet temperature and the acceptable risk of failure for a computer system, with the relationship shown in Table 1.

TABLE 1

| Ambient Inlet Temperature ($T_a$) | Maximum Acceptable Exposure Duration for a Desired Level of Risk (Hours) |
|---|---|
| $T_a < 35°$ C. | Unlimited Operation During Standard Warranty |
| $35°$ C. $< T_a < 40°$ C. | 1000 |
| $40°$ C. $< T_a < 45°$ C. | 100 |
| $45°$ C. $< T_a < 50°$ C. | 10 |

The exposure durations shown in Table 1 represent operation that is permitted while maintaining a desired level of risk. In one example, duration of operation in each band may be considered individually without consideration of duration incurred in other hands. In another example, the total lifetime risk of failure remains below a value (e.g., 0.001%) as long as an overall composite "risk index" remains below an acceptable threshold. Such a risk index may be formed from durations of operation in each band. For example, five hours of operation in the 45° C.<Ta<50° C. band could have the same effect on the risk index as 500 hours of operation in the 35° C.<Ta<40° C. band.

As an introductory example, assume that a computer system is provided with a standard warranty that allows accrual of 100 risk index units during the warranty period, and the computer system has an initial risk index of zero. Operation in any single temperature band greater than 35° C. for the number of hours shown in Table 1 raises the risk index to 100. Assume that partial risk index components accrued in each band may be summed, and that the computer system is deployed in a free air cooling data center where ambient inlet air temperature can be close to the outside temperature. Further assume that such a computer system has a useful life of five years, and is deployed in a region where the maximum average high temperature is 30° C. during the warmest summer months, and in an average year the temperature is in the range of 35-40° C. for 75 hours and in the range of 40-45° C. for 5 hours. With reference to Table 1, over five years the average 75 yearly hours of operation in the range of 35-40° C. will consume 375 hours of the 1000 hours of operation permitted in this band. If this usage is expressed as a risk index component on a scale from 1 to 100, 37.5 risk index units have been accrued. Similarly, the average five yearly hours of operation in the range of 40-45° C. will accrue a risk index component of 25 risk index units. Therefore, over the five year life of the computer system, the risk index will be 62.5 units, and 37.5 risk index units will remain. The risk to computer system operation should remain acceptable over the useful life of the computer system, despite periods of operation at elevated temperatures, and the operator will be in compliance with the warranty.

Of course, managing this type of excursion-based operation is much more complex than defining and maintaining a single inlet air temperature. The examples disclosed illustrate how excursion-based operation can be implemented to provide a flexible warranty compliance policy with the option to purchase additional warranty coverage to obtain a higher allowed risk index, and trigger changes in thermal operational parameters that can conserve risk index units once risk index units have accrued past a threshold. The examples may also be used to ensure compliance with SLAs and QoS metrics.

Figure 1:
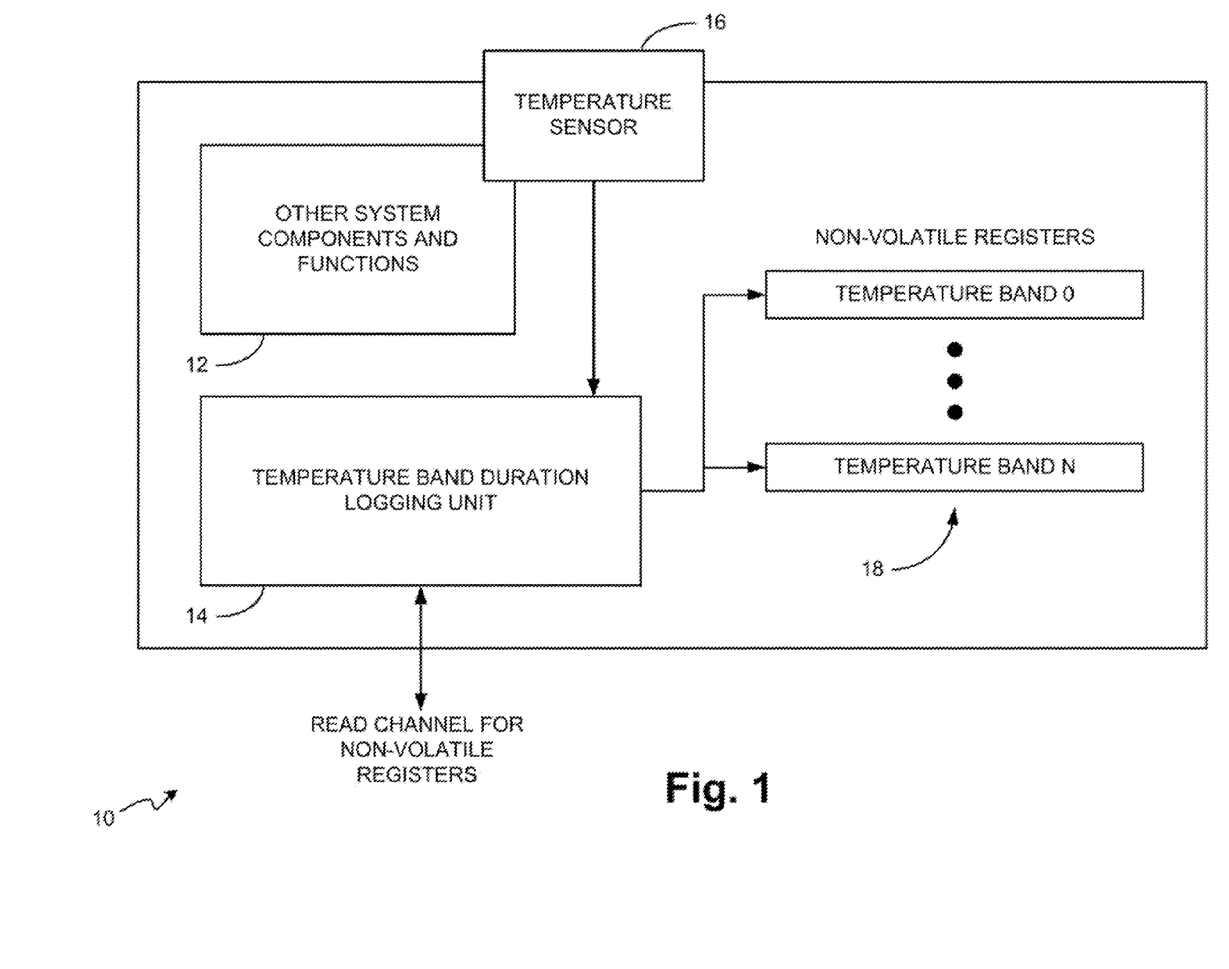
FIG. 1 is a block diagram of a system that illustrates how temperature band durations can be logged and reported.

FIG. 1 is a block diagram of a system 10 illustrating how temperature band operation durations can be logged and reported. System 10 includes other system components and functions 12, temperature band duration logging unit 14, temperature sensor 16, and non-volatile registers 18.

Other system components and functions 12 represent the components and functions provided by system 10. As will be discussed in greater derail below, examples may be deployed at many different levels, including an integrated circuit package level and a system enclosure level.

Temperature sensor 16 is coupled to temperature band duration logging unit 14. Under direction of unit 14, sensor 16 measures temperatures associated with other system components and functions 12. Note that the box representing sensor 16 is shown as partially overlapping the box representing other system components and functions 12 and extending beyond the box representing system 10. This configuration represents several examples, including an on-die temperature sensor of an integrated circuit (IC), a discrete temperature sensor in a computer equipment enclosure, and a sensor upstream in an air plenum measuring cooling air being delivered to an enclosure.

In one example, unit 14 takes a temperature measurement from temperature sensor 16 at a periodic interval, such as every second or every minute. Unit 14 determines a temperature band associated with the measurement, and updates a non-volatile register associated with the temperature band. In one configuration, the registers are initialized to zero when system 10 is manufactured, and one of the registers is incremented each interval based on a temperature measurement. In another configuration, the registers are initialized to starting values such as those shown in Table 1, and are decremented. For the former configuration, duration of operation in each band can determined by accessing unit 14 via a read channel provided for non-volatile registers 18, and total operation time can be determined by summing the contents of all non-volatile registers. Of course, a similar calculation can be made for the latter configuration with reference to the starting values. In accordance with the latter configuration, the registers may be configured to decrement below zero and record negative values.

Compared to configurations that log and retain all temperature measurements, the example shown in FIG. 1 has minimal data storage requirements. Consider an implementation where N=4 and there are five registers, with register 0 representing a temperature band below 35° C., register 5 representing a temperature band above 50° C., and registers 1-3 representing temperatures between 35° C. and 50° C. in 5° C. increments. If the non-volatile registers are 32-bits wide, the total amount of storage to log the duration of operation in for all bands is only 20 Bytes. Furthermore, a single 32-bit register initialized to zero can be incremented once every second for over 136 year without generating an overflow condition, which is significantly longer than the useful life of nearly any component or device.

Figure 2:
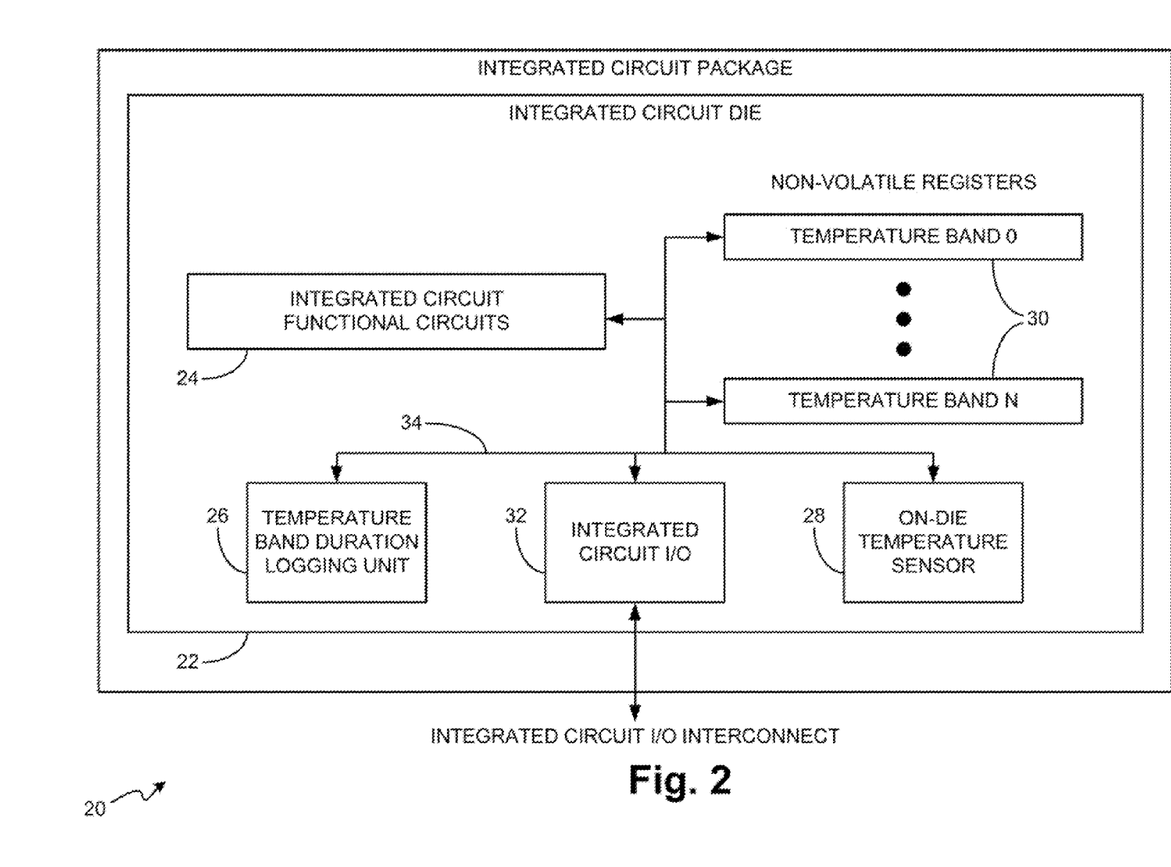
FIG. 2 is a block diagram showing an example of temperature band operation logging in an integrated circuit package.

FIG. 2 is a block diagram showing an example of temperature band duration logging in an integrated circuit package 20. Integrated circuit page 20 represents any integrated circuit where it is desirable to log temperature band durations, such as a central processor unit (CPU), a graphics processing unit (GPU), a dynamic random access memory integrated circuit on a memory module, and the like.

Within integrated circuit package 20 is an integrated circuit die 22. Fabricated within die 22 are integrated circuit functional circuits 24, temperature band duration logging unit 26, on-die temperature sensor 28, non-volatile registers 30, and integrated circuit I/O 32, all of which are coupled together via bus 34. Note that bus 34 is merely representative, and will typically be implemented by a plurality of interconnection fabrics coupling the functional boxes shown in FIG. 2 in different ways.

Integrated circuit functional circuits 24 vary based on the function of the integrated circuit. For example, if the integrated circuit is a CPU, circuits 24 will include instruction fetch and decode circuits, execution units, cache memory, and the like. If the integrated circuit is part of a memory module, circuits 24 will include rows and columns of storage cells, and other memory control logic.

Temperature band duration logging unit 26, on-die temperature sensor 28, and non-volatile registers 30 all function in a manner similar to the similarly named blocks shown in FIG. 1. Integrated circuit I/O 32 is coupled to an integrated circuit I/O interconnect, which will typically be implemented by electrical or optical connections, such as a land grid array.

Temperature band duration logging unit 26 provides access to non-volatile registers 30 via integrated circuit I/O 32. Circuit 32 may provide a dedicated path, or utilize an existing method provided by the integrated circuit. For example, many CPUs have model-specific registers (MSRs) for performance monitoring, debugging, testability, and program execution tracing. Examples may use the existing method of accessing the MSRs to access non-volatile registers 30. Similarly, FB-DIMM modules have an Advanced Memory Buffer (AMB) capable of outputting temperature measurements to a memory controller. The contents of non-volatile registers 30 may also be provided via the AMB.

The integrated circuit can be designed to ensure the integrity of temperature band duration logging by restricting write access to the registers so that they can only be incremented or decremented via temperature logging unit 26. In essence, such implementations provide a tamper-proof "thermal odometer", which can be useful when components are repurposed or recycled and can be extremely valuable during failure analysis.

Figure 3:
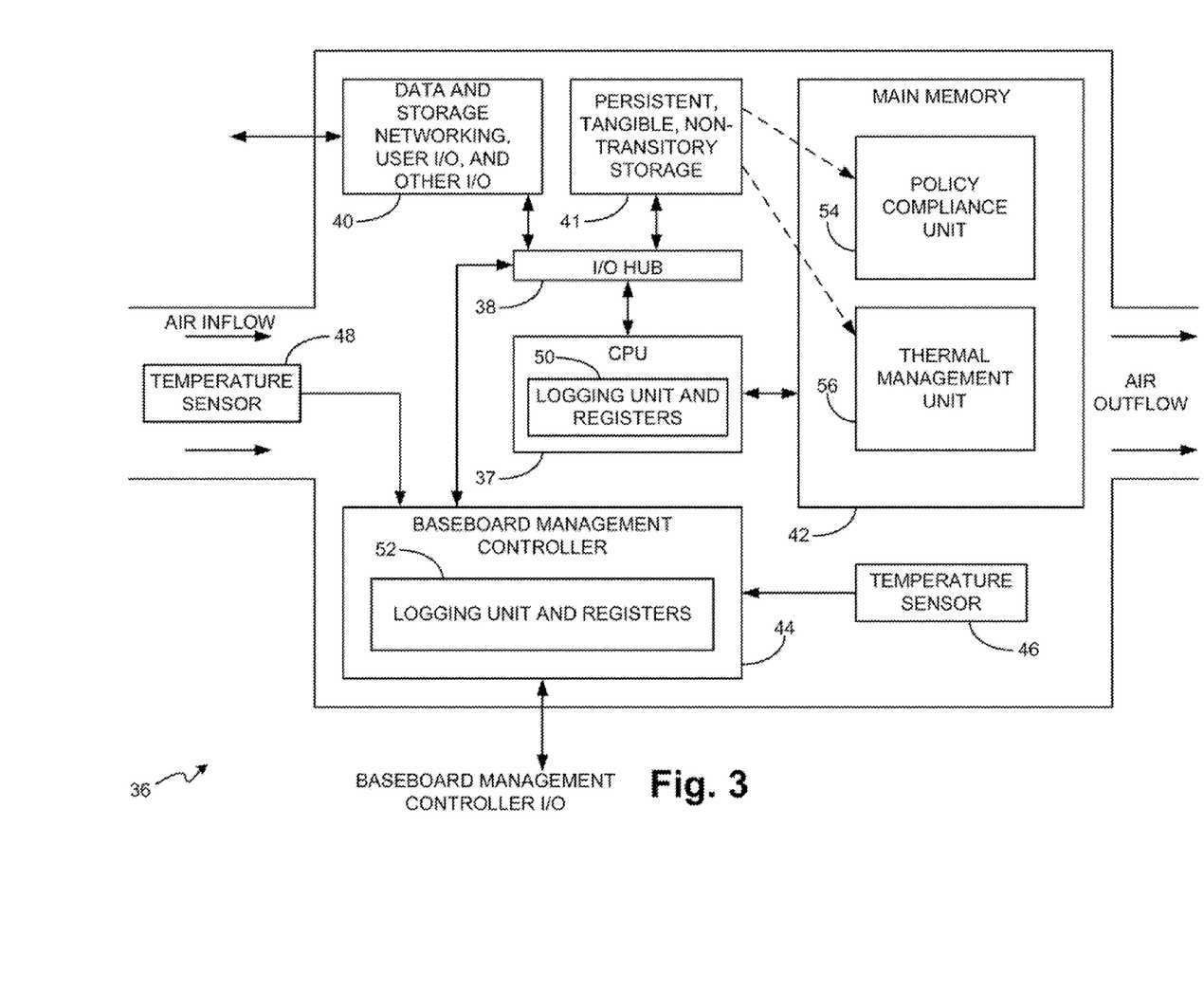
FIG. 3 is a block diagram of computer system showing additional implementation examples.

FIG. 3 is a block diagram of computer system 36 showing additional examples. Computer system 36 includes CPU 37, I/O hub 38, data and storage networking, user I/O, and other I/O 40, persistent, tangible, non-transitory storage 41, main memory 42, baseboard management controller (BMC) 44, and temperature sensors 46 and 48. CPU 37 is an example implementation of the integrated circuit shown in FIG. 2, and includes logging unit and registers 50. BMC 44 includes logging unit and registers 52. BMC 44, in combination with temperature sensors 40 and 48, are an example implementation of system 10 of FIG. 1.

CPU 37 is coupled to I/O hub 38, which in turn is coupled to data and storage networking, user I/O, and other I/O 40, persistent, tangible, non-transitory storage 41, and BMC 44. CPU 37 is also coupled to main memory 42. Temperature sensors 46 and 48 are coupled BMC 44.

BMC 44 is a processor that manages and monitors certain aspects of computer system 10, such as temperature, humidity, system clock speeds, power cycles, voltages, currents, Battery/UPS status, cooling fan speeds, and the like. Accordingly, BMC 44 is a logical candidate to host temperature band duration logging for attached sensors like temperature sensors 46 and 48, and communicate with devices with integrated temperature band duration logging, such as CPU 37.

Temperature sensor 48 measures the temperature of cooling air entering computer system 48, and may be placed at the point of cooling air intake or in a plenum that supplies cooling air to computer system 10. In a data center having free air cooling and using outside air without additional cooling, during warm weather sensor 48 may measure a temperature equal to or slightly above the outside air temperature, depending on the efficiency of the free air cooling infrastructure. Of course, data centers having free air cooling may also use other cooling techniques, such as evaporative coolers, geothermal cooling, cooling from adjacent bodies of water (such as rivers, lakes, and oceans), and auxiliary conventional cooling infrastructure components. Temperature sensor 46 measures the temperature inside the enclosure of computer system 36, and CPU 37 includes an on-die temperature sensor, as shown by way of example in FIG. 2.

As shown in FIG. 3, temperature band duration logging is performed at the cooling air intake by sensor 48, within the enclosure by sensor 46, and within CPU 37 by the CPU itself. Stored on persistent, tangible, non-transitory storage 41 are software modules for policy compliance unit 54 and thermal management unit 56. As shown in FIG. 3, units 54 and 56 have been loaded into main memory 42 for execution by CPU 37. Note that the functionality provided by units 54 and 56 may be provided in other devices, such as BMC 44, in a remote data center management computer, or even in a computer in a remote data center.

Assume that policy compliance unit 54 monitors compliance of a warranty policy. In an example discussed above, as computer system has an initial "risk index" of zero when it is manufactured, and a standard warranty includes 100 risk index units. In Table 1 above, ambient inlet temperatures are correlated to maximum acceptable exposure duration for a desired level of risk. In Table 2, five temperature bands are defined and ambient inlet temperatures are correlated to a risk index factor that represents the number of risk index units accrued per hour of operation. In this example, assume that each of the temperature sensors shown in FIG. 3 is coupled to a logging unit that uses five registers to log the duration of operation in each of the temperature bands of Table 2.

TABLE 2

| Ambient Inlet Temperature ($T_a$) | Risk Index Factor (Risk Index Units Accrual per Hour of Operation) |
|---|---|
| $T_a < 35°$ C. | 0 |
| $35°$ C. $< T_a < 40°$ C. | 0.1 |
| $40°$ C. $< T_a < 45°$ C. | 1 |
| $45°$ C. $< T_a < 50°$ C. | 10 |
| $50°$ C. $< T_a$ | Infinite (Immediate Warranty Revocation) |

Assume that Table 2 is used in conjunction with a warranty policy based on ambient inlet temperature measured by temperature sensor 48. A warranty policy for temperatures measured at sensor 46 would have higher temperature ranges, and a policy for temperatures measured on the die of CPU 37 would have even higher temperatures, as is appropriate for the type of component.

Note that a warranty policy can require that operation in each band reach a defined threshold before there is a breach of warranty. Alternatively, operation in two or more bands can be combined into a single risk index, and the warranty policy can be implemented using the risk index. For example, assume that policy compliance unit 54 reads the five registers associated with temperature sensor 48 and determines the number of hours of operation in each band. As discussed above, the registers may represent any suitable interval, such as minutes or seconds. In the example shown in Table 2, note that there is no increase in risk index units for operation in the band where $T_a < 35°$ C. Also note that there is an instant and infinite increase in risk index units for any operation in the band where $50°$ C.$<T_a$. In other words, any operation in this band is a breach of warranty. Of course, in an actual implementation an "infinite" risk index would be represented by a non-infinite state or value, such as an overflow condition or a flag that indicates any operation in that band.

After retrieving the number of hours of operation in each band, policy compliance unit 54 calculates the number of risk index units in each band by multiplying the hours of operation in each band with risk index factor of each band to form risk index components. The components are summed to form the risk index. Alternatively, other formulas with variable weightings may be used to form the risk index.

Warranty coverage may be tied to the risk index. For example, a standard warranty could include 100 risk index units, with customers purchasing additional risk index units for operation in excess of the standard warranty. For example a warranty that includes 150 risk index units could be priced at $1,000, and a warranty that includes 200 risk index units could be priced at $3,000.

Thermal management unit 50 performs various thermal management tasks based on accrued risk index units. As with policy compliance unit 54, thermal management unit 56 may be implemented elsewhere, such as BMC 44, a management computer in the data center, or another computer in a different data center.

Some of the potential actions taken by thermal management unit 56 include sounding alarms and sending notices, and various combinations of increasing cooling, decreasing the generation of heat, and load redistribution, with all these actions triggered by the number of accrued risk index units. In general, when the level of accrued risk index units reaches a threshold, and current operation is in a band with a high rate of accruance, it is desirable to take an action to lower the rate of accruance.

One simple action is to increase airflow to move to a lower temperature band, and thereby a lower the risk index accruance rate. However, increasing airflow does not lower the temperature of the incoming air. While increased airflow may lower temperatures measured at CPU 37 and sensor 46, it will have little effect on the temperature measured at temperature sensor 48. Note that a risk index may be formed from multiple sensors. As mentioned above, increasing the flow of incoming air may not lower the temperature of air measured at an enclosure entry point, but it could lower the temperature of components within the enclosure. Accordingly, in one example, a risk index could be accrued by using measurements from temperature sensor 48 when sensor 48 is measuring temperatures below 40.degree. C., and could be accrued by using measurements from CPU 37 and temperature sensor 46 when sensor 48 is measuring temperatures above 40.degree. C., thereby recognizing the benefit provided by increased airflow.

Another action routes cooler air to computer system 36. Perhaps the data center has limited air conditioning that can be routed to a number of servers, or the data center has access to a limited amount of stored geothermal cooling. The current risk index units of the servers can be used to determine which servers should receive the limited cooling available.

Yet another action that can reduce the accrual rate of the risk index is workload redistribution. If a data center has several older servers with high risk indexes and several newer servers with low risk indexes, the workloads can be shifted to the newer servers. Once cooler weather returns, workloads can be shifted back to the older servers. Also note that some workloads can be deferred. For example, an on-line retailer wants to ensure that online ordering is always available. However, workloads that make product suggestions based on user ratings and purchasing histories of similar products can be deferred.

Figure 4:
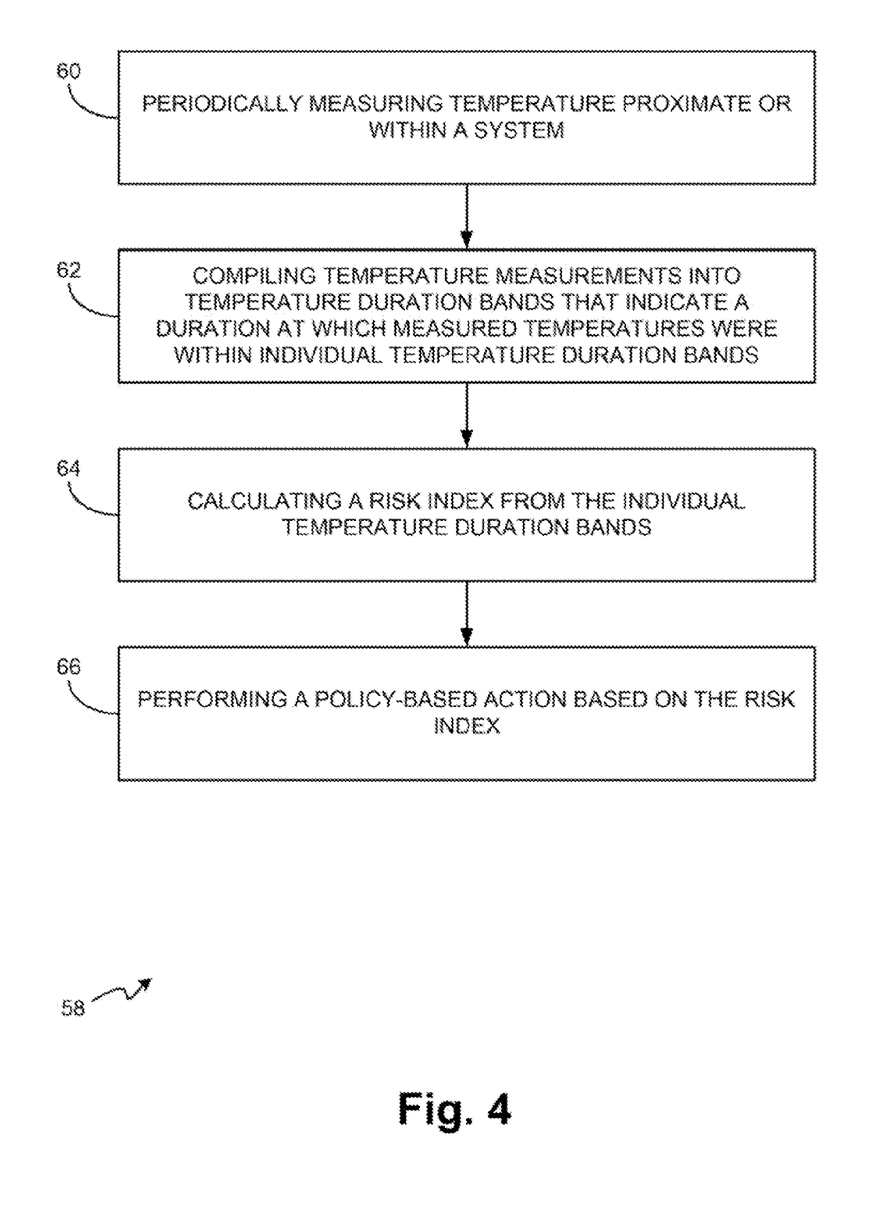
FIG. 4 shows a flowchart that describes a method performed by an example computer system.

FIG. 4 shows a flowchart 58 that describes a method performed by computer system 36 of FIG. 3 at a high level. In block 60, temperature is periodically measured within or close to computer system 36 via temperature sensors 46 or 48, or the on-die temperature sensor of CPU 37. Control passes to block 62.

At block 62, the temperature measurements are compiled into temperature duration bands that indicate a duration at which the measured temperatures were within individual temperature duration bands. This task is performed by the temperature band duration units in cooperation with the non-volatile temperature band registers shown in FIGS. 1 and 2. Control then passes to block 64.

At block 64, a risk index is calculated from the individual temperature duration bands, as discussed above with reference to Tables 1 and 2. Control then passes to block 66.

At block 66, a policy-based action is performed based on the risk index. Policy-based actions are discussed above with reference to policy compliance unit 54 and thermal management unit 56 of FIG. 3.

Figure 5:
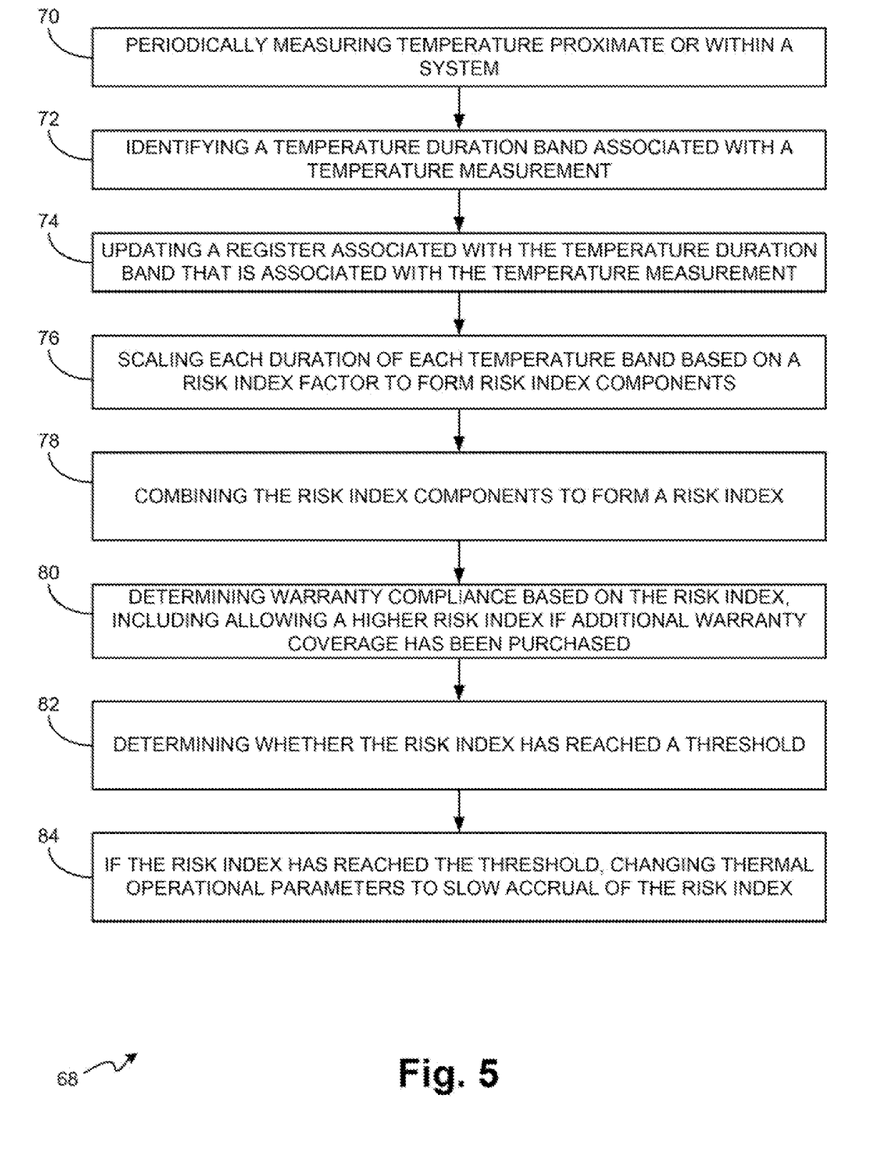
FIG. 5 shows a flowchart that describes an example method having additional detail.

FIG. 5 shows a flowchart 68 that describes with additional detail an example method. At block 70, temperature measurements are made periodically proximate or within a system, and control passes to block 72. Block 72 identifies a temperature duration band that is associated with a temperature measurement made in block 70. Control passes to block 74.

Block 74 updates a register associated with the temperature duration band that is associated with the temperature measurement. Control passes to block 76.

At block 76, each duration of each temperature band is scaled based on the risk index factor to form risk index components, and control passes to block 78 where the risk index components are combined to form the risk index, control then passes to block 80.

At block 80, warranty compliance is determined based on the risk index calculated in block 78, which may include allowing a higher risk index if additional warranty coverage has been purchased. Control passes to block 82. At block 82, the risk index is compared to a threshold to see if the risk index has reached or exceeded the threshold. Control passes to block 84, where if the risk index has reached the threshold thermal operational parameters are changed to an accruance rate of the risk index.

The examples described above provide additional flexibility for determining warranty compliance and adjusting thermal operating parameters. As discussed above, the examples may be successfully deployed in data centers using free air cooling. However, the examples may also be used in any environment where there may be excursions from an ideal temperature, such as traditional data centers with impaired cooling or temporary energy constraints.

In the foregoing description, numerous details are set forth to provide an understanding of the examples disclosed herein. However, it will be understood by those skilled in the an that the examples may be practiced without these details. While a limited number of examples have been disclosed, those skilled in the art will appreciate numerous modifications and variations therefrom. It is intended that the appended claims cover such modifications and variations as fall within the true spirit and scope of the disclosed examples.

What is claimed is:

1. A method comprising:
   periodically measuring, via a temperature sensor, a temperature proximate or within a system;
   compiling, via a temperature band duration logging unit, temperature measurements into logged temperature duration bands that indicate a duration at which measured temperatures are associated with individual temperature duration bands;
   calculating, via a processor, a risk index from at least one logged temperature duration band; and
   performing, via the processor, a policy-based action based on the risk index.

2. The method of claim 1 wherein performing a policy-based action based on the risk index comprises determining warranty compliance based on the risk index.

3. The method of claim 1 wherein performing a policy-based action based on the risk index comprises:
   determining whether the risk index has reached a threshold; and
   based on a determination that the risk index has reached the threshold, changing operational parameters that affect thermal characteristics to slow accrual of the risk index.

4. The method of claim 3 wherein performing the policy-based action based on the risk index further comprises:
   based on the determination that the risk index has reached the threshold, performing one of sounding an alarm and sending a notice.

5. The method of claim 1 wherein compiling temperature measurements into logged temperature duration bands that indicate a duration at which measured temperatures were within individual temperature duration bands comprises:
   identifying a logged temperature duration band associated with a temperature measurement; and updating a register associated with the temperature duration band that is associated with the temperature measurement.

6. The method of claim 1 wherein calculating a risk index from the individual temperature duration bands comprises:
scaling each duration of each temperature band based on a risk index factor to form risk index components; and
combining the risk index components to form the risk index.

7. A system comprising:
a temperature sensor to measure temperature proximate or within the system;
a plurality of registers, with each register associated with a temperature band, wherein each register is a non-transitory storage medium; and
a temperature band duration logging unit to couple to the temperature sensor and the plurality of registers to periodically measure a temperature using the temperature sensor and update a register of the plurality of registers corresponding to a temperature band of the measured temperature.

8. The system of claim 7 wherein the system is an integrated circuit package that includes a die within the integrated circuit package, the temperature sensor to measure the temperature of the die, and the temperature sensor and the plurality of registers are within the integrated circuit package.

9. The system of claim 7 wherein the system includes an enclosure, and the temperature sensor to measure the temperature of air within or entering the enclosure.

10. The system of claim 7 and further comprising:
a policy compliance unit to determine compliance with a policy based on contents of the plurality or registers.

11. The system of claim 10 wherein to determine compliance with the policy based on contents of the plurality or registers, the policy compliance unit is to:
retrieve a duration associated with each temperature band from the corresponding register of the plurality of registers;
calculate a risk index component based on the duration associated with each temperature band and a risk index factor associated with each temperature band; and
combine the risk index components to form the risk index.

12. The system of claim 7 and further comprising:
a thermal management unit to regulate parameters that affect thermal characteristics of the system based on contents of the plurality of registers.

13. The system of claim 12 further comprising the thermal management unit to perform one of to sound an alarm and to send a notice based on contents of the plurality of registers.

14. A non-transitory computer-readable medium comprising instructions executable by a processor that cause the processor to:
access logged information that indicates a duration of operation of a system associated with each of a plurality of temperature bands;
calculate a risk index from the logged information; and
perform a policy-based action based on the risk index.

15. The non-transitory computer-readable medium of claim 14 wherein the instructions to perform a policy-based action based on the risk index comprise instructions to determine warranty compliance based on the risk index.

16. The non-transitory computer-readable medium of claim 15 comprising instructions executable by the processor that further cause the processor to:
determine whether additional warranty coverage has been purchased; and
based on a determination that additional warranty coverage has been purchased, allow a higher risk index.

17. The non-transitory computer-readable medium (41) of claim 14 wherein the instructions to perform a policy-based action based in the risk index comprises instructions to:
determine whether the risk index has reached a threshold; and
if the risk index has reached the threshold, change operational parameters that affect thermal characteristics to slow an accruance rate of the risk index.

18. The non-transitory computer-readable medium of claim 14 wherein the instructions to calculate a risk index further comprises instructions to:
scale each duration of each temperature band based on a risk index factor to form risk index components; and
calculate the risk index from the risk index components.

19. The non-transitory computer-readable medium of claim 14 comprising instructions executable by the processor that further cause the processor to:
periodically measure a temperature proximate or within the system.

20. The non-transitory computer-readable medium of claim 19 comprising instructions executable by the processor that further cause the processor to:
log the measured temperature as logged information that indicates the duration of operation of the system associated with each of the plurality of temperature bands in a plurality of registers, wherein each register is associated with an individual temperature band.

* * * * *